(12) United States Patent
Ichiba et al.

(10) Patent No.: US 12,074,261 B2
(45) Date of Patent: Aug. 27, 2024

(54) PHOSPHOR PROTECTIVE FILM, WAVELENGTH CONVERSION SHEET WITH RELEASE FILM, WAVELENGTH CONVERSION SHEET, AND PRODUCTION METHOD FOR WAVELENGTH CONVERSION SHEET

(71) Applicant: TOPPAN PRINTING CO., LTD., Tokyo (JP)

(72) Inventors: Hiroki Ichiba, Tokyo (JP); Satoshi Maruyama, Tokyo (JP); Masato Kurokawa, Tokyo (JP); Yasuhiko Saito, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 697 days.

(21) Appl. No.: 17/239,198

(22) Filed: Apr. 23, 2021

(65) Prior Publication Data

US 2021/0249568 A1 Aug. 12, 2021

Related U.S. Application Data

(63) Continuation of application No. PCT/JP2019/041802, filed on Oct. 24, 2019.

(30) Foreign Application Priority Data

Oct. 26, 2018 (JP) ................................ 2018-201688

(51) Int. Cl.
*H01L 33/50* (2010.01)
*B32B 7/023* (2019.01)
*B32B 37/14* (2006.01)
*G02B 1/11* (2015.01)

(52) U.S. Cl.
CPC ............ *H01L 33/502* (2013.01); *B32B 7/023* (2019.01); *B32B 37/14* (2013.01); *G02B 1/11* (2013.01)

(58) Field of Classification Search
CPC ......... H01L 33/502; G02B 1/11; B32B 7/032; B32B 37/14
See application file for complete search history.

(56) References Cited

U.S. PATENT DOCUMENTS

| 2010/0227085 A1 | 9/2010 | Yoshihara |
| 2017/0320306 A1* | 11/2017 | Iwase .................. F21V 9/30 |
| 2018/0022881 A1 | 1/2018 | Seki et al. |
| 2019/0329528 A1 | 10/2019 | Murata et al. |

FOREIGN PATENT DOCUMENTS

| CN | 105637660 A | * | 6/2016 | ............ B32B 15/00 |
| CN | 107848254 A | * | 3/2018 | ............ B32B 27/08 |
| JP | H10-319231 A | | 12/1998 | |
| JP | 2005-195571 A | | 7/2005 | |
| JP | 2005-315786 A | | 11/2005 | |
| JP | 2010-237648 A | | 10/2010 | |
| JP | 2011-013567 A | | 1/2011 | |
| JP | 2015-185685 A | | 10/2015 | |
| JP | 2016-182744 A | | 10/2016 | |
| JP | 2017-016134 A | | 1/2017 | |
| JP | 2017-043058 A | | 3/2017 | |
| JP | 2017-181900 A | | 10/2017 | |
| JP | 2018-109706 A | | 7/2018 | |
| WO | WO-2018079495 A1 | * | 5/2018 | ............ B32B 23/08 |

OTHER PUBLICATIONS

Office Action issued in corresponding Chinese Patent Application No. 201980070184.X dated Feb. 6, 2024 (25 pages).
International Searching Authority, "International Search Report," issued in connection with International Patent Application No. PCT/JP2019/041802, dated Dec. 24, 2019.
International Searching Authority, "Written Opinion," issued in connection with International Patent Application No. PCT/JP2019/041802, dated Dec. 24, 2019.
Office Action issued in corresponding Chinese Patent Application No. 201980070184.X, dated Jan. 19, 2023.
Office Action issued in corresponding Japanese Patent Application No. 2020-552612 dated Mar. 5, 2024 (7 pages).

* cited by examiner

*Primary Examiner* — Robert D Harlan
(74) *Attorney, Agent, or Firm* — Foley & Lardner LLP

(57) ABSTRACT

A production method for a wavelength conversion sheet, including: a bonding step of bonding a multilayer film and a release film together to obtain a phosphor protective film, the multilayer film including a barrier film, the release film being releasable from the multilayer film; a phosphor layer formation step of forming a phosphor layer containing phosphors on a surface of the multilayer film of the phosphor protective film to obtain a wavelength conversion sheet with the release film; and a release step of releasing the release film from the wavelength conversion sheet with the release film.

17 Claims, 8 Drawing Sheets

PHOSPHOR PROTECTIVE FILM, WAVELENGTH CONVERSION SHEET WITH RELEASE FILM, WAVELENGTH CONVERSION SHEET, AND PRODUCTION METHOD FOR WAVELENGTH CONVERSION SHEET

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/041802, filed on Oct. 24, 2019, which is based upon and claims the benefit of priority to Japanese Patent Application No. 2018-201688, filed on Oct. 26, 2018, the disclosures of which are incorporated herein by reference in their entireties.

TECHNICAL FIELD

The present disclosure relates to a phosphor protective film, a wavelength conversion sheet with a release film, a wavelength conversion sheet, and a production method for a wavelength conversion sheet.

BACKGROUND

Some light-emitting units of liquid crystal displays such as backlight units and electroluminescent light-emitting units cause a laser beam generated by an LED to be incident on a phosphor so as to change the wavelength of the laser beam. Since a change in the wavelength leads to a change in color, light of various wavelengths, that is, light that has been changed to various colors, can be used to display a color image on a screen.

Phosphors may suffer from performance deterioration when they come into contact with oxygen, water vapor or the like for a long period of time. To prevent such performance deterioration, a wavelength conversion sheet is formed by overlaying a protective film on a phosphor layer containing phosphors, or by sandwiching a phosphor layer between protective films. A protective film is known which, for example, is obtained by vacuum deposition of an inorganic thin film layer on a resin film, where the inorganic thin film layer blocks the permeation of oxygen, water vapor and the like (see PTL 1).

[Citation List] [Patent Literature] PTL 1: JP 2011-13567 A

SUMMARY OF THE INVENTION

Technical Problem

However, the phosphor protective film described above may suffer from the formation of wrinkles mainly due to heat and tension applied to the resin film during the production process. When a phosphor layer is laminated on a protective film after such wrinkles occur, it is difficult to form a phosphor layer having a sufficiently uniform thickness. Therefore, the obtained wavelength conversion sheet is liable to have problems such as uneven light emission from the phosphors. The formation of wrinkles may be suppressed by increasing the thickness of a support film of the protective film.

As monitors and mobile devices such as smartphones become thinner, the wavelength conversion sheet used in these devices is also required to be thinner. As the wavelength conversion sheet becomes thinner, the protective film needs to be made thinner, and therefore, there is a concern that a sufficient thickness of the support film may not be ensured, leading to a greater likelihood of wrinkles being formed in the phosphor protective film, causing more significant unevenness in light emission from the phosphors.

The present disclosure has been made in view of the problems in the conventional technique described above, and has an object of providing a phosphor protective film, a wavelength conversion sheet with a release film, a wavelength conversion sheet, and a production method for a wavelength conversion sheet that, while enabling a wavelength conversion sheet to be made thinner, suppress the formation of wrinkles in the phosphor protective film, and suppress unevenness in light emission from phosphors caused by the wrinkles.

Solution to Problem

In order to achieve the above object, the present disclosure provides a production method for a wavelength conversion sheet, including: a bonding step of bonding together a multilayer film and a release film to obtain a phosphor protective film, the multilayer film including a barrier film, the release film being releasable from the multilayer film; a phosphor layer formation step of forming a phosphor layer containing phosphors on a surface of the multilayer film of the phosphor protective film to obtain a wavelength conversion sheet with the release film; and a release step of releasing the release film from the wavelength conversion sheet with the release film.

According to the production method above, by providing the phosphor protective film with a release film until after the phosphor layer formation step, it is possible to sufficiently suppress the formation of wrinkles in the phosphor protective film, due to the presence of the release film. The release film is released in the release step and does not remain on the obtained wavelength conversion sheet, thus ensuring a sufficient thickness to improve wrinkling. Further, the wavelength conversion sheet obtained following the release step can be made sufficiently thin.

In the production method above, in the bonding step, the multilayer film and the release film may be bonded to each other in a state where wrinkles in the multilayer film have been smoothed out. As a result, the formation of wrinkles in the phosphor protective film can be more sufficiently suppressed.

In the production method above, in the phosphor layer formation step, the phosphor layer may be formed between two sheets of the phosphor protective film. As a result, the phosphor layer is more sufficiently protected from oxygen, water vapor and the like, thus more sufficiently suppressing performance deterioration.

In the production method above, the multilayer film may include a support film between the barrier film and the release film, and the total thickness of the support film and the release film may represent 60% or more of the total thickness of the phosphor protective film. The support film has a function of improving wrinkling together with the release film. Further, when the total thickness of the support film and the release film represents 60% or more of the total thickness of the phosphor protective film, it is possible to more sufficiently suppress the formation of wrinkles in the phosphor protective film.

In the production method above, the multilayer film may not have a support film between the barrier film and the release film, and the thickness of the release film may represent 50% or more of the total thickness of the phosphor protective film. In this case, the wavelength conversion sheet can be made even thinner by not including the support film. Further, when the thickness of the release film represents 50% or more of the total thickness of the phosphor protective film, it is possible to more sufficiently suppress the formation of wrinkles in the phosphor protective film.

In the production method above, the barrier film may have a barrier film substrate, and the barrier film substrate may have a thickness of 9 to 25 μm.

In the production method above, the barrier film may have a barrier film substrate, and an inorganic thin film layer provided on the barrier film substrate.

In the production method above, the multilayer film may be provided with a functional layer on a side facing the release film, and the functional layer may be a layer that exhibits at least one type of function selected from the group consisting of an interference fringe prevention function, an antireflection function, a light diffusion function, an antistatic function, and a scratch prevention function.

In the production method above, the variation (3σ) in the total thickness of the multilayer film may be 1.5 μm or more, and the kinetic friction coefficient of the surface of the functional layer may be 0.4 or less. When the variation (3σ) in the total thickness of the multilayer film including a functional layer is 1.5 μm or more, and the kinetic friction coefficient of the surface of the functional layer is 0.4 or less, it is possible to prevent damage to a light guide plate that makes contact with the wavelength conversion sheet when the wavelength conversion sheet is incorporated into a display.

In the production method above, the variation (3σ) in the total thickness of the phosphor protective film may be 1.0 μm or less. According to the production method of a present embodiment, even when the multilayer film is provided with a functional layer, it is possible to reduce the variation (3σ) in the total thickness of the phosphor protective film to 1.0 μm or less by bonding the release film to the functional layer surface. Further, when the variation (3σ) in the total thickness of the phosphor protective film is 1.0 μm or less, it is possible to reduce the variation in the thickness of the phosphor layer when the wavelength conversion sheet is produced. Consequently, it is possible to suppress changes in the emitted color caused by variations in the thickness of the phosphor layer, thereby achieving uniform color emission.

In the production method above, the peel strength according to JIS K6854-3 between the multilayer film and the release film may be 0.05 to 1.0 N/25 mm. When the peel strength is in the above range, it is possible to more sufficiently suppress the formation of wrinkles in the phosphor protective film, due to the presence of the release film, and it is also possible to smoothly release the release film from the multilayer film in the release step.

Furthermore, the present disclosure provides a production method for a wavelength conversion sheet, including: a bonding step of bonding a main body and a release film together to obtain a phosphor protective film, the main body including a support film, the release film being releasable from the main body; a phosphor layer formation step of forming a phosphor layer containing phosphors on a surface of the main body of the phosphor protective film to obtain a wavelength conversion sheet with the release film; and a release step of releasing the release film from the wavelength conversion sheet with the release film, wherein the thickness of the release film represents 50% or more of the total thickness of the phosphor protective film.

According to the production method above, by providing the phosphor protective film with a release film until after the phosphor layer formation step, it is possible to sufficiently suppress the formation of wrinkles in the phosphor protective film, due to the presence of the release film. The release film is released in the release step and does not remain on the obtained wavelength conversion sheet, thus ensuring a sufficient thickness to improve wrinkling. In particular, because the thickness of the release film represents 50% or more of the total thickness of the phosphor protective film, it is possible to sufficiently obtain the effect of suppressing the formation of wrinkles in the phosphor protective film. Further, the wavelength conversion sheet obtained following the release step can be made sufficiently thin.

In the production method above, in the bonding step, the main body and the release film may be bonded to each other in a state where wrinkles in the main body have been smoothed out. As a result, the formation of wrinkles in the phosphor protective film can be more sufficiently suppressed.

In the production method above, in the phosphor layer formation step, the phosphor layer may be formed between two sheets of the phosphor protective film. As a result, the phosphor layer is more sufficiently protected from oxygen, water vapor and the like, thus more sufficiently suppressing performance deterioration.

In the production method above, the support film may have a thickness of 12 to 50 μm. As a result, it is possible to obtain a wavelength conversion sheet that has sufficient strength and that has been made sufficiently thin.

In the production method above, the release film may have a thickness of 25 to 150 μm. Consequently, it is possible to prevent the total thickness of the phosphor protective film from becoming excessively large, while also sufficiently obtaining the effect of suppressing the formation of wrinkles in the phosphor protective film.

In the production method above, the multilayer film may be provided with a functional layer on a side facing the release film, and the functional layer may be a layer that exhibits at least one type of function selected from the group consisting of an interference fringe prevention function, an antireflection function, a light diffusion function, an antistatic function, and a scratch prevention function.

Moreover, the present disclosure provides a phosphor protective film including a multilayer film which has a barrier film; and a release film which is provided on one surface of the multilayer film and is releasable from the multilayer film. According to the phosphor protective film above, as a result of providing a release film which is releasable, it is possible to sufficiently suppress the formation of wrinkles in the phosphor protective film. The release film is released during production of the wavelength conversion sheet and does not remain on the obtained wavelength conversion sheet, thus ensuring a sufficient thickness to improve wrinkling. Further, the wavelength conversion sheet obtained using the phosphor protective film above can be made sufficiently thin.

In the phosphor protective film above, the multilayer film may include a support film arranged between the barrier film and the release film, and the total thickness of the support film and the release film may represent 60% or more of the total thickness of the phosphor protective film.

In the phosphor protective film above, the multilayer film may not have a support film between the barrier film and the release film, and the thickness of the release film may represent 50% or more of the total thickness of the phosphor protective film.

In the phosphor protection film above, the barrier film may include a barrier film substrate, and the barrier film substrate may have a thickness of 9 μm to 25 μm.

In the phosphor protection film above, the barrier film may have a barrier film substrate, and an inorganic thin film layer provided on the barrier film substrate.

In the phosphor protection film above, the multilayer film may be provided with a functional layer on a side facing the release film, and the functional layer may be a layer that exhibits at least one type of function selected from the group consisting of an interference fringe prevention function, an antireflection function, a light diffusion function, an anti-static function, and a scratch prevention function.

Furthermore, the present disclosure provides a phosphor protective film including a main body and a release film, the main body including a support film, the release film being provided on one surface of the main body and being releasable from the main body, where the thickness of the release film represents 50% or more of the total thickness of the phosphor protective film. According to the phosphor protective film above, as a result of providing a release film which is releasable, it is possible to sufficiently suppress the formation of wrinkles in the phosphor protective film. The release film is released during production of the wavelength conversion sheet and does not remain on the obtained wavelength conversion sheet, thus ensuring a sufficient thickness to improve wrinkling. In particular, because the thickness of the release film represents 50% or more of the total thickness of the phosphor protective film, it is possible to sufficiently obtain the effect of suppressing the formation of wrinkles in the phosphor protective film. Further, the wavelength conversion sheet obtained using the phosphor protective film above can be made sufficiently thin.

Moreover, the present disclosure provides a wavelength conversion sheet with a release film, the wavelength conversion sheet including a first phosphor protective film and a second phosphor protective film, each of the first and second phosphor protective films being the phosphor protective film of the present disclosure, and a phosphor layer containing phosphors, the phosphor layer being sandwiched between the first and second phosphor protective films, the first phosphor protective film being arranged with the release film thereof constituting one of opposing outermost layers of the wavelength conversion sheet, the second phosphor protective film being arranged with the release film thereof constituting the other of the opposing outermost layers of the wavelength conversion sheet.

In addition, the present disclosure provides a wavelength conversion sheet formed by releasing the release film from the wavelength conversion sheet with a release film of the present disclosure. The wavelength conversion sheet above is obtained using the phosphor protective film of the present disclosure and the wavelength conversion sheet with a release film obtained using the same, sufficient reduction in thickness is achieved while the formation of wrinkles is also sufficiently suppressed.

Advantageous Effects of the Invention

The present disclosure provides a phosphor protective film, a wavelength conversion sheet with a release film, a wavelength conversion sheet, and a production method for a wavelength conversion sheet that, while enabling a wavelength conversion sheet to be made thinner, suppress the formation of wrinkles in the phosphor protective film, and suppress unevenness in light emission from phosphors caused by the wrinkles.

DETAILED DESCRIPTION

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

With reference to the accompanying drawings, some embodiments of the present invention will be described.

<Phosphor Protective Film and Production Method Therefor>

A phosphor protective film according to the present embodiment includes a multilayer film having a barrier film, and a release film which is provided on one surface of the multilayer film and is releasable from the multilayer film. Here, the multilayer film may be provided with a functional layer on a side facing the release film. The release film may be bonded to the multilayer film via a pressure-sensitive adhesive layer. The barrier film may have a structure in which an inorganic thin film layer is formed on a barrier film substrate, and may have a structure in which a gas barrier covering layer is additionally formed on the inorganic thin film layer.

Figure 1:
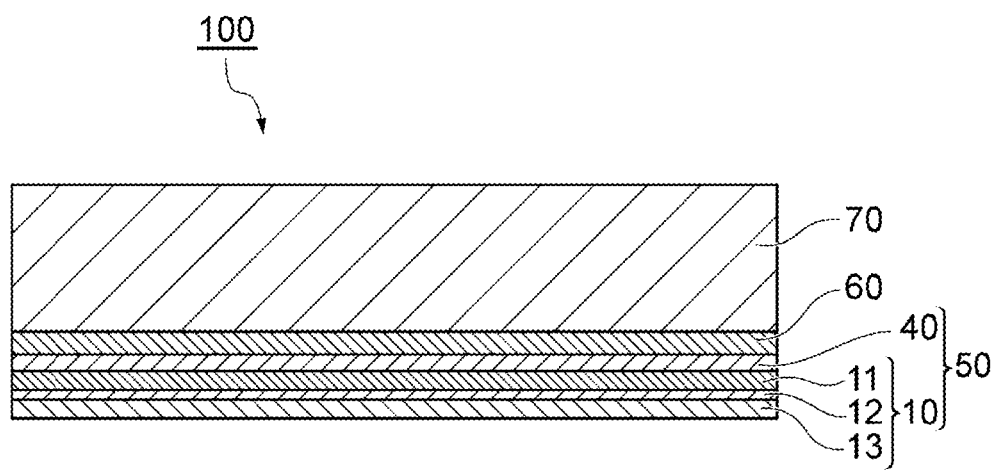
FIG. 1 is a schematic cross-sectional view showing an embodiment of a phosphor protective film according to the present disclosure.

FIG. 1 is a schematic cross-sectional view showing an embodiment of a phosphor protective film. As shown in FIG. 1, the phosphor protective film 100 has a structure in which a multilayer film 50, which is comprised of a barrier film 10 and a functional layer 40, and a release film 70 are bonded to each other via a pressure-sensitive adhesive layer 60. In the phosphor protective film 100, the multilayer film 50 has only the functional layer 40 between the barrier film 10 and the release film 70, and does not have a support film (resin film).

In the phosphor protective film 100, the barrier film 10 has a structure in which an inorganic thin film layer 12 and a gas barrier covering layer 13 are laminated in this order on the barrier film substrate 11.

Furthermore, in the phosphor protective film 100, the release film 70 is made of a resin film having a single layer structure. The release film 70 may be a film having a multilayer structure in which a plurality of resin films are laminated.

In the phosphor protective film 100, the functional layer 40 may be formed by applying a coating material to the barrier film 10, or by laminating a vapor-deposited film on the barrier film 10. An optical or mechanical function can be imparted by the functional layer 40 comprised of the coating film made of a coating material, or the vapor-deposited film.

In the phosphor protective film 100, the thickness of the release film 70 preferably represents 50% or more of the thickness (total thickness) of the phosphor protective film 100. When the ratio of the thickness of the release film 70 to the total thickness of the phosphor protective film 100 is 50% or more, the influence of the release film 70 becomes dominant, making it possible to more sufficiently prevent the formation of wrinkles in the phosphor protective film 100. From the perspective of more sufficiently obtaining the effect of improving wrinkling in the phosphor protective film 100, the ratio of the thickness of the release film 70 to the total thickness of the phosphor protective film 100 is preferably 60% or more, and more preferably 70% or more. On the other hand, from the perspective of more sufficiently obtaining the effect of improving wrinkling in the phosphor protective film 100, while also preventing the total thickness of the phosphor protective film 100 from being excessively large, the ratio of the thickness of the release film 70 is preferably 90% or less, and more preferably 86% or less. The thickness (total thickness) of the phosphor protective film 100 may be 50 to 300 µm.

Figure 2:
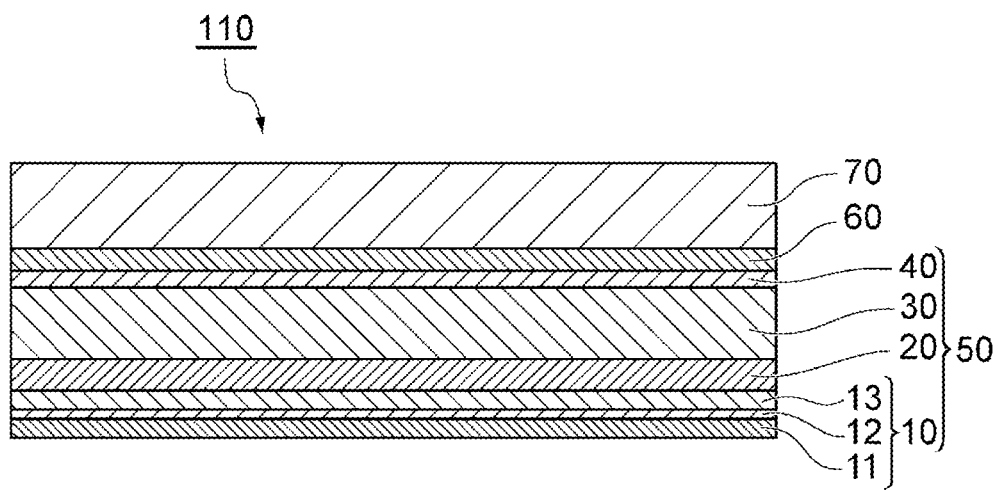
FIG. 2 is a schematic cross-sectional view showing another embodiment of a phosphor protective film according to the present disclosure.

FIG. 2 is a schematic cross-sectional view showing another embodiment of a phosphor protective film. As shown in FIG. 2, the phosphor protective film 110 has a structure in which a multilayer film 50, which is comprised of a barrier film 10, an adhesive layer 20, a support film 30 and a functional layer 40, and a release film 70 are bonded to each other via a pressure-sensitive adhesive layer 60. The phosphor protective film 110 has a different layer configuration from the phosphor protective film 100 in that the multilayer film 50 includes, between the barrier film 10 and the functional layer 40, a support film (resin film) 30 which is bonded with the barrier film 10 via the adhesive layer 20.

In the phosphor protective film 110, the functional layer 40 may be formed by applying a coating material to the support film 30, or by laminating a vapor-deposited film on the support film 30.

In the phosphor protective film 110, the total thickness of the support film 30 and the release film 70 preferably represents 60% or more of the thickness (total thickness) of the phosphor protective film 110. When the ratio of the total thickness of the support film 30 and the release film 70 to the total thickness of the phosphor protective film 110 is 60% or more, it is possible to more sufficiently prevent the formation of wrinkles. From the perspective of more sufficiently obtaining the effect of improving wrinkling in the phosphor protective film 110, the ratio of the total thickness of the support film 30 and the release film 70 to the total thickness of the phosphor protective film 110 is preferably 60% or more, and more preferably 70% or more. On the other hand, from the perspective of more sufficiently obtaining the effect of improving wrinkling in the phosphor protective film 110, while also preventing an excessively large total thickness of the phosphor protective film 110, the ratio of the total thickness of the support film 30 and the release film 70 to the total thickness of the phosphor protective film 110 is preferably 90% or less, and more preferably 86% or less. The thickness (total thickness) of the phosphor protective film 110 may be 50 to 300 µm.

Each of the layers constituting the phosphor protective films 100 and 110 will be described in detail below.

The barrier film substrate 11 is not particularly limited, but a substrate having a total light transmittance of 85% or more is desirable. For example, a polyethylene terephthalate film, a polyethylene naphthalate film, or the like can be used as a substrate having high transparency and excellent heat resistance. The thickness of the substrate may, for example, be 9 to 50 µm, and is preferably 12 to 30 µm, more preferably 12 to 25 µm. When the barrier film substrate 11 has a thickness of 9 µm or more, sufficient strength of the barrier film substrate 11 can be ensured, while when the thickness is 50 µm or less, it is possible to efficiently and economically produce a long roll.

Examples of materials that may be used for the inorganic thin film layer 12 include, but are not limited to, aluminum oxide, silicon oxide, magnesium oxide, and mixtures thereof. Of these materials, aluminum oxide or silicon oxide is preferably used from the perspective of barrier properties and productivity.

Furthermore, the thickness (film thickness) of the inorganic thin film layer 12 is preferably in a range of 5 to 500 nm, and is more preferably in a range of 10 to 100 nm. When the film thickness is 5 nm or more, there is a tendency that a uniform film can be easily formed, and that the function as a gas barrier material can be more sufficiently achieved. When the film thickness is 500 nm or less, there is a tendency that more sufficient flexibility can be maintained owing to such a thin film, and the formation of cracks in the thin film due to external factors, such as bending and stretching after film formation, can be more reliably prevented.

The gas barrier covering layer 13 is provided to prevent various types of secondary damage that can occur during post processing, and to impart better barrier properties. From the perspective of obtaining excellent barrier properties, the gas barrier covering layer 13 preferably contains at least one component selected from the group consisting of hydroxyl group-containing polymer compounds, metal alkoxides, metal alkoxide hydrolysates, and metal alkoxide polymers. The gas barrier covering layer 13 may further contain a silane coupling agent.

Specific examples of hydroxyl group-containing polymer compounds include water-soluble polymers, such as polyvinyl alcohol, polyvinyl pyrrolidone, and starch, and in particular, the barrier properties are best when polyvinyl alcohol is used.

The metal alkoxide is a compound expressed by a general formula: $M(OR)_n$ (where M is a metal atom such as Si, Ti, Al or Zr, R is an alkyl group such as $—CH_3$ or $—C_2H_5$, and n is an integer corresponding to the valence of M). Specific examples include tetraethoxysilane $[Si(OC_2H_5)_4]$ and triisopropoxy aluminum $[Al(O-iso-C_3H_7)_3]$. Tetraethoxysilane and triisopropoxy aluminum are preferred because they are relatively stable in an aqueous solvent after being hydrolyzed. Furthermore, examples of the metal alkoxide hydrolysate and metal alkoxide polymer include silicic acid (Si (OH)+) as a tetraethoxysilane hydrolysate and a tetraethoxysilane polymer, and aluminum hydroxide $(Al(OH)_3)$ as a tripropoxy aluminum hydrolysate and a tripropoxy aluminum polymer. Moreover, examples of the silane coupling agent include compounds expressed by a general formula: $R^1Si(OR^2)_n$ (where $R^1$ is an organic functional group, and $R^2$ is an alkyl group such as $CH_3$ or $C_2H_5$). Specific examples include silane coupling agents such as ethyltrimethoxysilane, vinyltrimethoxysilane, γ-chloropropylmethyldimethoxysilane, γ-chloropropyltrimethoxysilane, glycidoxypropyltrimethoxysilane, γ-methacryloxypropyltrimethoxysilane, and γ-methacryloxypropylmethyldimethoxysilane. In addition, a known additive such as an isocyanate compound, a dispersant, a stabilizer, a viscosity modifier, or a colorant may be added as necessary to the gas barrier covering layer 13 to an extent that does not impair the gas barrier properties.

The thickness (film thickness) of the gas barrier covering layer 13 is preferably in a range of 50 to 1,000 nm, and is more preferably in a range of 100 to 500 nm. When the film thickness is 50 nm or more, more sufficient gas barrier properties tend to be obtained, and when the film thickness is 1,000 nm or less, sufficient flexibility tends to be maintained owing to such a thin film.

The support film 30 is not particularly limited, but a resin film having a total light transmittance of 85% or more is desirable. For example, a polyethylene terephthalate film, a polyethylene naphthalate film, or the like can be used as a resin film having high transparency and excellent heat resistance.

The thickness of the support film 30 is preferably determined in consideration of the thickness of the barrier film 10, the thickness of the adhesive layer 20, the thickness of the release film 70, and the like so that the ratio of the total thickness of the support film 30 and the release film 70 to the total thickness of the phosphor protective film 110 is 60% or more. The thickness of the support film 30 may, for example, be 12 to 150 μm, and is preferably 25 to 120 μm, more preferably 35 to 100 μm. When the total thickness of the support film 30 and the release film 70 represents 60% or more of the total thickness of the phosphor protective film 110, sufficient strength for obtaining the effect of improving wrinkling in the phosphor protective film 110 is ensured, and when the thickness of the support film 30 is 150 μm or less, it is easier to prevent the total thickness of the phosphor protective film 110 from being excessively large. Furthermore, from the perspective of reducing the thickness of the wavelength conversion sheet, the thickness of the support film 30 is preferably less than or equal to the thickness of the release film 70, and is more preferably less than or equal to two-thirds of the thickness of the release film 70.

The functional layer 40 may, for example, be a coating film containing a binder resin and microparticles. Further, as a result of the microparticles being embedded in the binder resin such that the microparticles are partially exposed from the surface of the functional layer 40, micro asperities may be formed on the surface of the functional layer 40. By providing the functional layer 40 on the surface of the multilayer film 50, that is, on the surface of the wavelength conversion sheet, it is possible to more sufficiently prevent the formation of interference fringes such as Newton's rings. Further, a light diffusion function may be exerted due to the scattering of incident light, as well as an anti-reflection function.

The binder resin may be, but is not limited to, a resin having excellent optical transparency. More specifically, examples of materials that can be used include a thermoplastic resin, thermosetting resin or ionizing radiation-curable resin, including a polyester resin, acrylic resin, acrylic urethane resin, polyester acrylate resin, polyurethane acrylate resin, urethane resin, epoxy resin, polycarbonate resin, polyamide resin, polyimide resin, melamine resin, and phenolic resin. Of these resins, an acrylic resin may be preferably used because of having good light resistance and optical properties. These resins may be used singly or in combination of two or more. Furthermore, the use of a thermosetting resin, an ionizing radiation-curable resin or the like may allow an anti-scratch function to be exerted.

Examples of the microparticles may include, but are not limited to, inorganic microparticles such as of silica, clay, talc, calcium carbonate, calcium sulfate, barium sulfate, titanium oxide or alumina, and organic microparticles such as of a styrene resin, urethane resin, silicone resin, acrylic resin or the like. These resins may be used singly or in combination of two or more.

The mean particle size of the fine particles is preferably 0.1 to 30 μm, and more preferably 0.5 to 10 μm. When the mean particle size of the microparticles is 0.1 μm or more, an excellent interference fringe prevention function tends to be obtained, and when it is 30 μm or less, the transparency tends to be improved even further. The content of the microparticles in the functional layer 40 is preferably 0.5 to 30% by mass, and more preferably 3 to 10% by mass relative to the total mass of the functional layer 40. When the content of the microparticles is 0.5% by mass or more, the light diffusion function and the effect of preventing the occurrence of interference fringes tend to be further improved, and when it is 30% by mass or less, reduction in brightness tends to be sufficiently suppressed.

The thickness of the functional layer 40 is preferably 0.1 to 20 μm, and more preferably 0.3 to 10 μm. When the functional layer 40 has a thickness of 0.1 μm or more, there is a tendency that a uniform film is easily obtained, and that at least one type of function selected from the group consisting of an interference fringe prevention function, an antireflection function, a light diffusion function, an anti-static function, and a scratch prevention function is sufficiently obtained. On the other hand, when the functional layer 40 has a thickness of 20 μm or less and microparticles are used in the functional layer 40, an asperity-imparting effect tends to be more easily obtained due to the microparticles being exposed at the surface of the functional layer 40.

Furthermore, examples of the adhesive or pressure-sensitive adhesive constituting the adhesive layer 20 include acrylic-based adhesives, epoxy-based adhesives, and urethane-based adhesives. The adhesive preferably contains an epoxy resin. The adhesive containing an epoxy resin improves the adhesion between the barrier film 10 and the support film 30. Examples of the pressure-sensitive adhesive include acrylic-based pressure-sensitive adhesives, polyvinyl ether-based pressure-sensitive adhesives, urethane-based pressure-sensitive adhesives, silicone-based pressure-sensitive adhesives, and starch paste-based pressure-sensitive adhesives. The thickness of the adhesive layer 20 is preferably 0.5 to 50 μm, more preferably 1 to 20 μm, and even more preferably 2 to 6 μm. When the adhesive layer 20 has a thickness of 0.5 μm or more, adhesion between the barrier film 10 and the support film 30 is more easily obtained, and when the thickness is 50 μm or less, better gas barrier properties can be easily obtained.

The oxygen permeability of the adhesive layer 20 may be, for example, 1,000 $cm^3/(m^2 \cdot day \cdot atm)$ or less in the thickness direction when the thickness is 5 μm. The oxygen permeability is preferably 500 $cm^3/(m^2 \cdot day \cdot atm)$ or less, more preferably 100 $cm^3/(m^2 \cdot day \cdot atm)$ or less, even more preferably 50 $cm^3/(m^2 \cdot day \cdot atm)$ or less, and particularly preferably 10 $cm^3/(m^2 \cdot day \cdot atm)$ or less. With the oxygen permeability of the adhesive layer 20 being 1,000 $cm^3/(m^2 \cdot day \cdot atm)$ or less, a phosphor protective film 110 capable of suppressing dark spots can be obtained, even when the inorganic thin film layer 12 or the gas barrier covering layer 13 has defects. The lower limit of the oxygen permeability is not particularly limited, but may, for example, be 0.1 $cm^3/(m^2 \cdot day \cdot atm)$.

The release film 70 is preferably a resin film having an elastic modulus sufficient to smooth out the wrinkles that have formed in the production process of the barrier film 10, and to suppress the formation of additional wrinkles. From this perspective, the release film 70 may be a polyethylene terephthalate film, a polyethylene naphthalate film, a polypropylene film, or the like. Among these, a polyethylene terephthalate film is preferable because the formation of wrinkles can be more sufficiently suppressed. The release film 70 may be a resin film having a single layer structure, or may be a resin film having a multilayer structure in which a plurality of resin films are laminated. Furthermore, the release film 70 has a protective function of protecting the multilayer film 50 from damage such as scratches. Consequently, the release film 70 is capable of further preventing damage from occurring to the multilayer film 50 when the phosphor protective films 100 and 110 are used, and when the wavelength conversion sheet is produced.

The release film 70 may be colored. In this case, the release film 70 can be made more visible and more easily released when the wavelength conversion sheet is produced, and further, it is possible to prevent the release procedure from being forgotten. The release film 70 is finally released and removed, and does not need to be transparent, and therefore, it has an advantage that it can be colored. Furthermore, from the same perspective, the release film 70 may be opaque or semi-transparent, or may be printed or depict a design or pattern.

The thickness of the release film 70 is preferably adjusted to 50% or more of the total thickness of the phosphor protective film 100. The thickness of the release film 70 in the phosphor protective film 100 may, for example, be 25 to 250 μm, and is preferably 50 to 230 μm, more preferably 60 to 200 μm, even more preferably 75 to 180 μm. With the thickness of the release film 70 representing 50% or more of the total thickness of the phosphor protective film 100, sufficient strength for obtaining the effect of improving wrinkling in the phosphor protective film 100 is ensured, and with the thickness of the release film 70 being 250 μm or less, it is easier to prevent the total thickness of the phosphor protective film 100 from being excessively large.

The thickness of the release film 70 is preferably adjusted so that the total thickness of the support film 30 and the release film 70 represents 60% or more of the total thickness of the phosphor protective film 110. The thickness of the release film 70 in the phosphor protective film 110 is, for example, 25 to 250 μm, preferably 30 to 230 μm, more preferably 40 to 200 μm, and even more preferably 50 to 180 μm. With the total thickness of the support film 30 and the release film 70 representing 60% or more of the total thickness of the phosphor protective film 110, sufficient strength for obtaining the effect of improving wrinkling in the phosphor protective film 110 is ensured, and with the thickness of the release film 70 being 250 μm or less, it is easier to prevent the total thickness of the phosphor protective film 110 from being excessively large.

The Young's modulus of the release film 70 is preferably 290 MPa or more, and more preferably 290 to 380 MPa. When the release film 70 has a Young's modulus of 290 MPa or more, it is possible to more sufficiently obtain the effect of improving wrinkling in the phosphor protective films 100 and 110. In the present specification, the Young's modulus of the release film 70 is measured using test pieces obtained by punching the release film 70 into a size of 15 mm in width and 100 mm in length. An Autograph AG-X (manufactured by Shimadzu Corp.) is used as the measurement apparatus, and the Young's modulus is measured under the following conditions: tensile speed 300 mm/min, temperature 25° C., and humidity 40% RH.

The release film 70 may contain, as necessary, additives such as an antistatic agent, an ultraviolet absorber, a plasticizer, and a slip agent. Furthermore, at least one surface of the release film 70 may be subjected to corona treatment, flame treatment, plasma treatment, or the like.

The pressure-sensitive adhesive layer 60 is provided to retain the release film 70 in a state of being attached to the multilayer film 50. When the release film 70 is released from the multilayer film 50, the pressure-sensitive adhesive layer 60 is released with the release film 70. The pressure-sensitive adhesive layer 60 is unnecessary when the release film 70 is a self-adhesive film or the like, that is, when it is capable of adhering to the multilayer film 50 without the pressure-sensitive adhesive layer 60. Examples of the pressure-sensitive adhesive constituting the pressure-sensitive adhesive layer 60 include acrylic-based pressure-sensitive adhesives, polyvinyl ether-based pressure-sensitive adhesives, urethane-based pressure-sensitive adhesives, silicone-based pressure-sensitive adhesives, and starch paste-based pressure-sensitive adhesives.

The thickness of the pressure-sensitive adhesive layer 60 is preferably 0.5 to 20 μm, more preferably 1 to 10 μm, and even more preferably 1 to 5 μm. With the thickness of the pressure-sensitive adhesive layer 60 being 0.5 μm or more, adhesion between the release film 70 and the multilayer film 50 is more easily obtained, and with the thickness thereof being 20 μm or less, the effect of improving wrinkling in the phosphor protective films 100 and 110 is more easily obtained, and it is easier to prevent the pressure-sensitive adhesive layer 60 from remaining on the multilayer film 50 when the pressure-sensitive adhesive layer 60 is released from the multilayer film 50 with the release film 70.

The adhesive strength between the pressure-sensitive adhesive layer 60 and the release film 70 is preferably greater than the adhesive strength between the pressure-sensitive adhesive layer 60 and the multilayer film 50. Consequently, it is easier to release the pressure-sensitive adhesive layer 60 from the multilayer film 50 with the release film 70. The adhesive strength between the pressure-sensitive adhesive layer 60 and the release film 70 may be made greater than the adhesive strength between the pressure-sensitive adhesive layer 60 and the multilayer film 50 by applying corona treatment to the surface of the release film 70 to which the pressure-sensitive adhesive is applied.

In the present specification, the release film 70 is releasable from the multilayer film 50, which refers to the fact that, when the pressure-sensitive adhesive layer 60 is present, the release film 70 is releasable from the multilayer film 50 with the pressure-sensitive adhesive layer 60 without damaging the multilayer film 50. From the perspective of easily releasing a release film with a pressure-sensitive adhesive layer from the multilayer film 50, the adhesive strength between the release film with a pressure-sensitive adhesive layer and the multilayer film 50 (in the present embodiment, between the pressure-sensitive adhesive layer 60 and the functional layer 40) is preferably 1.0 N/25 mm or less, and more preferably 0.7 N/25 mm or less. From the perspective of more easily improving wrinkling, the adhesive strength therebetween is preferably 0.05 N/25 mm or more, and more preferably 0.1 N/25 mm or more. The adhesive strength is a value measured using the following method. A test sample obtained by cutting out the phosphor protective film to a predetermined size (for example, 25 mm×100 mm) is used to measure the release force required to release the release film with a pressure-sensitive adhesive layer from the multilayer film 50 using an Autograph AG-X (manufactured by Shimadzu Corp.). The measurement conditions are as follows: T-type release, tensile speed 300 mm/min, 25° C., and 40% RH atmosphere.

The phosphor protective films 100 and 110 can be produced through the following process using a roll-to-roll method. After firstly preparing a roll of the barrier film substrate 11, a long barrier film 10 is produced by laminating an inorganic thin film layer 12 and/or a gas barrier covering layer 13 in this order on the barrier film substrate 11 while the barrier film substrate 11 is being unwound and conveyed, and the barrier film 10 is wound. In the case where a support film 30 is laminated, the gas barrier covering layer 13 is coated with an adhesive to form an adhesive layer 20 while the barrier film 10 is being unwound and conveyed, and the support film 30 is overlaid on and pressed against the adhesive layer 20 to obtain a barrier film with a support film. Thereafter, a functional layer 40 is formed on the barrier film substrate 11 of the barrier film 10, or on the support film 30 of the barrier film with a support film to obtain a multilayer film 50.

Then, the release film 70 is coated with a pressure-sensitive adhesive to form a pressure-sensitive adhesive layer 60 while it is being unwound and conveyed, and the multilayer film 50, after being wound in a roll form, is overlaid on and pressed against the pressure-sensitive adhesive layer 60 to obtain the phosphor protective film 100 or 110.

In preparation for forming the inorganic thin film layer 12 on the barrier film substrate 11, an anchor coat layer may be provided between the barrier film substrate 11 and the inorganic thin film layer 12 to enhance the adhesion therebetween. The anchor coat layer may have barrier properties to prevent permeation of moisture, oxygen and the like. The anchor coat layer may be made of a resin which is selected, for example, from polyester resins, isocyanate resins, urethane resins, acrylic resins, polyvinyl alcohol resins, ethylene vinyl alcohol resins, vinyl-modified resins, epoxy resins, oxazoline group-containing resins, modified styrene resins, modified silicone resins, alkyl titanate, and the like. The anchor coat layer may be formed of the resins mentioned above used singly or in combination of two or more as a composite resin. The inorganic thin film layer 12 may be formed using a vapor deposition method. Examples of the vapor deposition method include vacuum vapor deposition, sputtering, and ion plating. In the process of forming the inorganic thin film layer 12, tension or heat may be unavoidably applied to the barrier film substrate 11. Due to the tension or heat, wrinkles may be formed in the barrier film substrate 11.

Next, the gas barrier covering layer 13 can be formed, for example, by coating the surface of the inorganic thin film layer 12 with an aqueous solution or water/alcohol mixed solution containing at least one component selected from the group consisting of metal alkoxides, metal alkoxide hydrolysates and metal alkoxide polymers, a hydroxyl group-containing polymer compound, and if necessary, a silane coupling agent, and then heating and drying the coating at, for example, 80 to 250° C. In the process of forming the gas barrier covering layer 13, tension is unavoidably applied to the barrier film substrate 11. The tension or heating and drying can cause wrinkles to form in the barrier film substrate 11.

The temperature during the heating and drying in the process of forming the gas barrier covering layer 13 is preferably 210° C. or less, and more preferably 180° C. or less. When the temperature is 210° C. or less, the wrinkle coefficient α can be further reduced. On the other hand, the temperature during the heating and drying mentioned above is preferably 120° C. or more, and more preferably 150° C. or more. When the temperature is 120° C. or more, the water vapor barrier properties can be further improved.

Next, if a support film 30 is laminated, the barrier film 10 and the support film 30 can be adhered to each other through a roll-to-roll method using a laminating apparatus. That is, the support film 30 is unwound from a roll thereof, and an adhesive (or a pressure-sensitive adhesive) is applied to the support film 30 using an adhesive coating apparatus to form an adhesive layer 20. Then, the support film 30 having formed thereon the adhesive layer 20 is guided into an oven by a guide roll, and the adhesive layer 20 is dried. The temperature in the oven may be changed in a stepwise fashion using a plurality of units, each of which is set to 25 to 200° ° C. After drying, the support film 30 is guided by a guide roll and transferred to nip rolls. Meanwhile, the barrier film 10 is unwound from a roll thereof and transferred to the nip rolls, and at the nip rolls is pressed against and bonded to the surface of the support film 30 on which the adhesive has been applied. The laminating pressure between the nip rolls may, for example, be 0.05 to 0.2 MPa. Then, the obtained barrier film with a support film is wound into a roll form. According to this method, thermal wrinkles can be reduced by laminating the support film 30 onto the barrier film 10.

In the step of bonding the support film 30 and the barrier film 10 via the adhesive layer 20, wrinkles can be reduced because a barrier film 10 free of wrinkles is retained by the support film 30 when the support film 30 and the barrier film 10 are pressed against each other by the nip rolls.

Next, the functional layer 40 can be formed by applying, for example, a coating liquid containing a binder resin and microparticles to the surface of the barrier film substrate 11 or the support film 30, and then drying and curing the coating. The coating liquid may be applied using a gravure coater, a dip coater, a reverse coater, a wire-bar coater, a die coater, or the like. As mentioned above, the functional layer 40 may be formed on the support film 30 before the barrier film 10 and the support film 30 are bonded to each other.

Next, the release film 70 and the multilayer film 50 can be bonded to each other through a roll-to-roll method using a laminating apparatus. That is, the release film 70 is unwound from a roll thereof, and a pressure-sensitive adhesive is applied to the release film 70 using a pressure-sensitive adhesive coating apparatus to form a pressure-sensitive adhesive layer 60. Then, the multilayer film 50 having formed thereon the pressure-sensitive adhesive layer 60 is guided into an oven by a guide roll, and the pressure-sensitive adhesive layer 60 is dried. The temperature in the oven may be changed in a stepwise fashion using a plurality of units, each of which is set to 25 to 200° C. After drying, the release film 70 is guided by a guide roll and transferred to nip rolls. Meanwhile, the multilayer film 50 is unwound from a roll thereof and transferred to the nip rolls, and at the nip rolls is pressed against and bonded to the surface of the release film 70 on which the pressure-sensitive adhesive has been applied. The laminating pressure between the nip rolls may, for example, be 0.05 to 0.5 MPa. Then, the obtained phosphor protective film 100 or 110 is wound into a roll form. According to this method, by laminating the release film 70 onto the multilayer film 50, a phosphor protective film 100 or 110 with sufficiently reduced thermal wrinkles can be obtained.

In the step of bonding the release film 70 and the multilayer film 50 via the pressure-sensitive adhesive layer 60, wrinkles can be reduced because a multilayer film 50 free of wrinkles is retained by the release film 70 when the release film 70 and the multilayer film 50 are pressed against each other by the nip rolls. The effect of reducing the wrinkles can be more sufficiently obtained when the thickness of the release film 70 or the total thickness of the release film 70 and the support film 30 is 60% or more of the total thickness of the phosphor protective film 100 or the total thickness of the phosphor protective film 110.

The phosphor protective film according to the present embodiment may include a main body having a support film, and a release film which is provided on one surface of the main body and is releasable from the main body. Here, the main body may be provided with a functional layer on a side facing the release film. The release film may be bonded to the main body via a pressure-sensitive adhesive layer. The main body may include a primer layer for improving the adhesion with a phosphor layer. In the present embodiment, the main body does not have to include a barrier film. In a phosphor protective film having such a configuration, the thickness of the release film is 50% or more of the total thickness of the phosphor protective film. A phosphor protective film having such a configuration is useful when the phosphor layer itself has high durability, and can be made even thinner because it does not require a barrier film.

Figure 8:
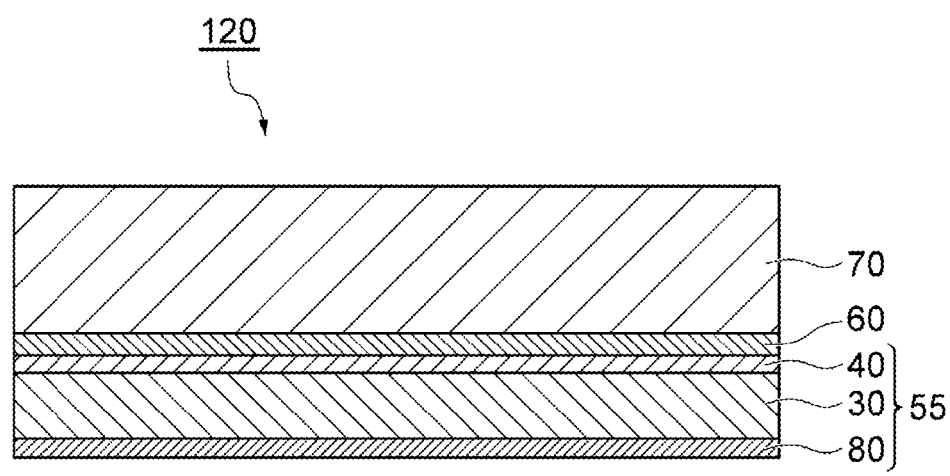
FIG. 8 is a schematic cross-sectional view showing another embodiment of a phosphor protective film according to the present disclosure.

FIG. 8 is a schematic cross-sectional view showing another embodiment of a phosphor protective film. As shown in the drawing, a phosphor protective film 120 has a structure in which a main body 55, which is comprised of a support film 30, a functional layer 40 and a primer layer 80, and a release film 70 are bonded to each other via a pressure-sensitive adhesive layer 60.

The support film 30, the functional layer 40, and the release film 70 of the phosphor protective film 120 may be the same support film 30, functional layer 40, and release film 70 used in the phosphor protective films 100 and 110.

In the phosphor protective film 120, the thickness of the support film 30 is preferably 12 to 50 µm, more preferably 12 to 25 µm, and even more preferably 12 to 15 µm. When the thickness of the support film 30 is 50 µm or less, it is possible to achieve further reduction in the thickness of the wavelength conversion sheet. Furthermore, when the support film 30 has a thickness of 12 µm or more, sufficient strength of the support film 30 can be ensured.

In the phosphor protective film 120, the thickness of the release film 70 is preferably determined in consideration of the thickness of each layer constituting the phosphor protective film 120 so that the ratio of the thickness of the release film 70 to the total thickness of the phosphor protective film 120 is 50% or more. The thickness of the release film 70 may, for example, be 25 to 150 µm, and is preferably 50 to 150 µm, even more preferably 75 to 150 µm. When the thickness of the release film 70 represents 50% or more of the total thickness of the phosphor protective film 120, sufficient strength for obtaining the effect of improving wrinkling in the phosphor protective film 120 is ensured, and when the thickness of the release film 70 is 150 µm or less, it is easier to prevent the total thickness of the phosphor protective film 120 from being excessively large.

In the phosphor protective film 120, the thickness of the release film 70 preferably represents 60% or more of the thickness (total thickness) of the phosphor protective film 120. When the ratio of the thickness of the release film 70 to the total thickness of the phosphor protective film 120 is 60% or more, it is possible to more sufficiently prevent the formation of wrinkles. From the perspective of more sufficiently obtaining the effect of improving wrinkling in the phosphor protective film 120, the ratio of the thickness of the release film 70 to the total thickness of the phosphor protective film 120 is more preferably 70% or more. On the other hand, from the perspective of more sufficiently obtaining the effect of improving wrinkling in the phosphor protective film 120, while also preventing an excessively large total thickness of the phosphor protective film 120, the ratio of the thickness of the release film 70 to the total thickness of the phosphor protective film 120 is preferably 90% or less, and more preferably 86% or less. The thickness (total thickness) of the phosphor protective film 120 may be 40 to 170 µm.

The primer layer 80 is a layer for improving the adhesion between the main body 55 and the phosphor layer, and may be formed, for example, using a primer layer forming composition containing a silane coupling agent. The thickness of the primer layer 80 may, for example, be 0.001 to 1 µm.

Except for replacing the multilayer film 50 with the main body 55, the phosphor protective film 120 can be produced using the same method as that for producing the phosphor protective film 100 or 110.

In the phosphor protective films 100, 110 and 120, the variation ($3\sigma$) in the total thickness of the multilayer film 50 or the main body 55 may be 1.5 µm or more, and the kinetic friction coefficient of the surface of the functional layer 40 may be 0.4 or less. When the variation ($3\sigma$) in the total thickness of the multilayer film 50 or the main body 55 including a functional layer is 1.5 µm or more, and the kinetic friction coefficient of the surface of the functional layer 40 is 0.4 or less, it is possible to prevent damage to a light guide plate that makes contact with the wavelength conversion sheet when the wavelength conversion sheet is incorporated into a display. From the perspective of more sufficiently obtaining the effect of preventing damage to a light guide plate, the variation (3σ) in the total thickness of the multilayer film 50 or the main body 55 may be 1.7 μm or more, or 2.0 μm or more.

Furthermore, the variation (3σ) in the total thickness of the phosphor protective films 100, 110 and 120 may be 1.0 μm or less. When the variation (3σ) in the total thickness of the phosphor protective films 100, 110 and 120 is 1.0 μm or less, it is possible to produce a wavelength conversion sheet in which the variation in the thickness of the phosphor layer is reduced. Consequently, it is possible to suppress unevenness in the emitted color caused by variations in the thickness of the phosphor layer. From the perspective of more sufficiently obtaining such an effect, the variation (3σ) in the total thickness of the phosphor protective films 100, 110 and 120 may be 0.8 μm or less, or 0.5 μm or less.

The variation (3σ) in the total thickness of the multilayer film 50 or the main body 55, and the variation (3σ) in the total thickness of the phosphor protective films 100, 110 and 120 can be measured, for example, with a contact-type film thickness meter. Furthermore, the kinetic friction coefficient of the surface of the functional layer 40 can be measured, for example, using an Autograph AG-X (manufactured by Shimadzu Corp.).

In the phosphor protective films 100, 110 and 120, the peel strength according to JIS K6854-3 between the multilayer film 50 or the main body 55 and the release film 70 may be 0.05 to 1.5 N/25 mm, or 0.05 to 1.0 N/25 mm. When the peel strength is in the above range, it is possible to more sufficiently suppress the formation of wrinkles in the phosphor protective films 100, 110 and 120, due to the presence of the release film 70, and it is also possible to smoothly release the release film 70 from the multilayer film 50 or the main body 55 in the release step. Furthermore, although the release film 70 is bonded to the multilayer film 50 or the main body 55 via the pressure-sensitive adhesive layer 60, when the peel strength is 0.05 N/25 mm or more, it is possible to prevent a portion of the pressure-sensitive adhesive layer 60 from remaining on the multilayer film 50 or the main body 55 after the release step. Moreover, when the peel strength is 1.0 N/25 mm or less, it is possible to prevent a portion of the functional layer 40 in contact with the pressure-sensitive adhesive layer 60 from being released with the release film 70 when the release film 70 is released. The peel strength can be adjusted to the above range by appropriately adjusting, for example, the type and content of resin, curing agent, and the like used for the functional layer 40, and the type of pressure-sensitive adhesive used for the pressure-sensitive adhesive layer 60.

<Wavelength Conversion Sheet and Production Method Therefor, and Light-Emitting Unit>

Figure 3:
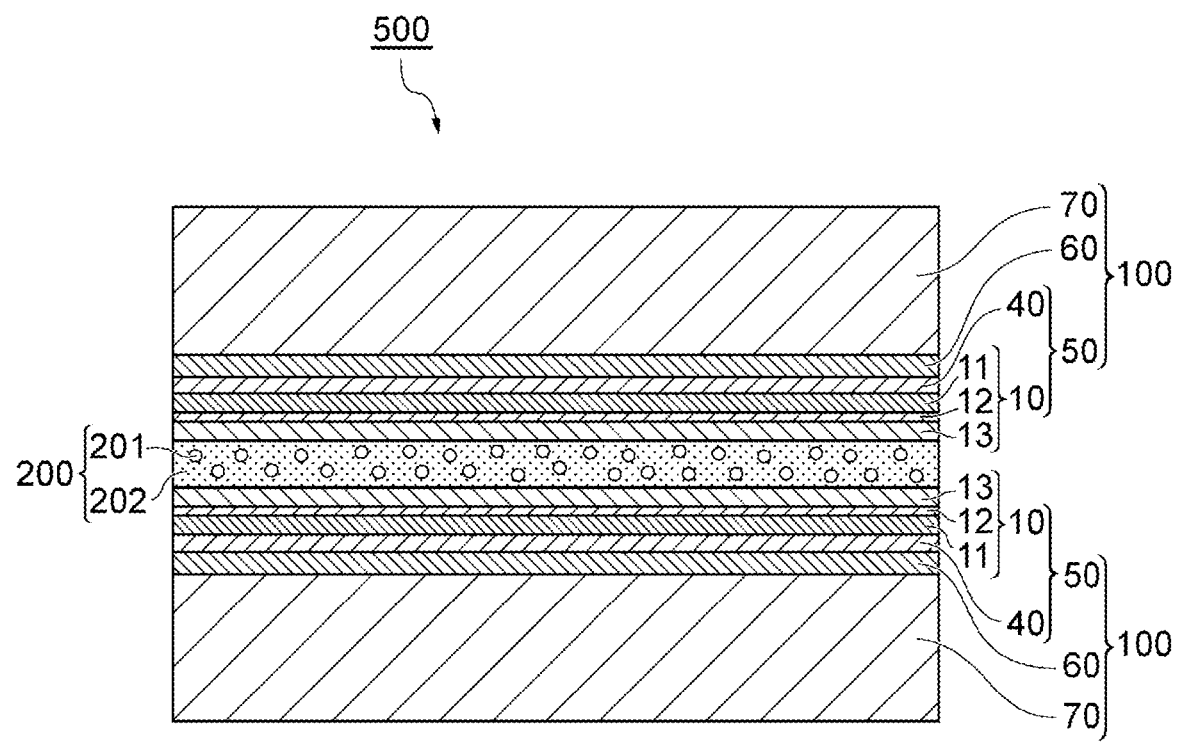
FIG. 3 is a schematic cross-sectional view showing an embodiment of a wavelength conversion sheet with a release film according to the present disclosure.
Figure 4:
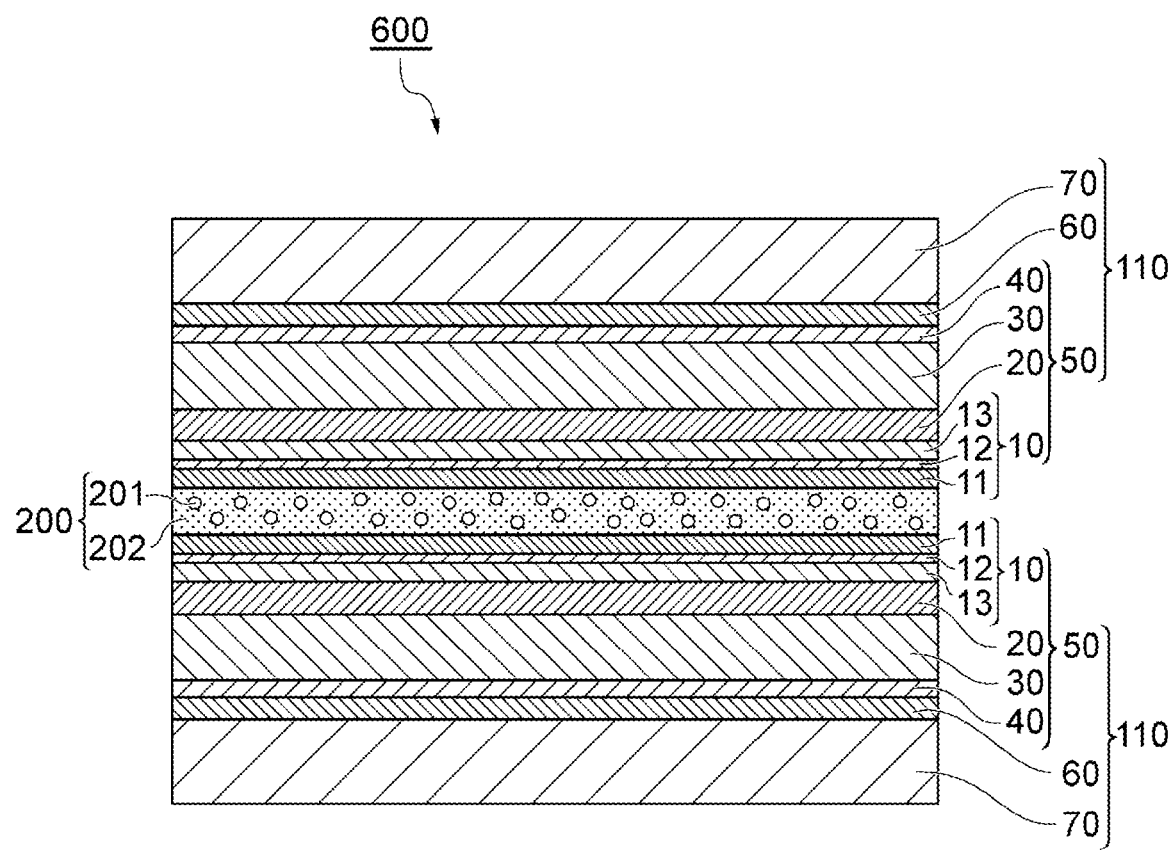
FIG. 4 is a schematic cross-sectional view showing another embodiment of a wavelength conversion sheet with a release film according to the present disclosure.
Figure 5:
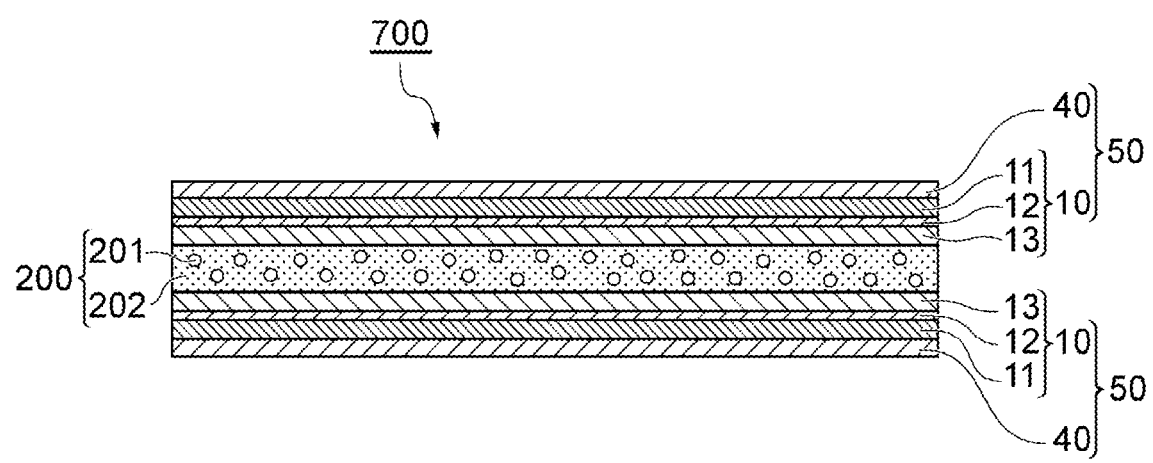
FIG. 5 is a schematic cross-sectional view showing an embodiment of a wavelength conversion sheet according to the present disclosure.
Figure 6:
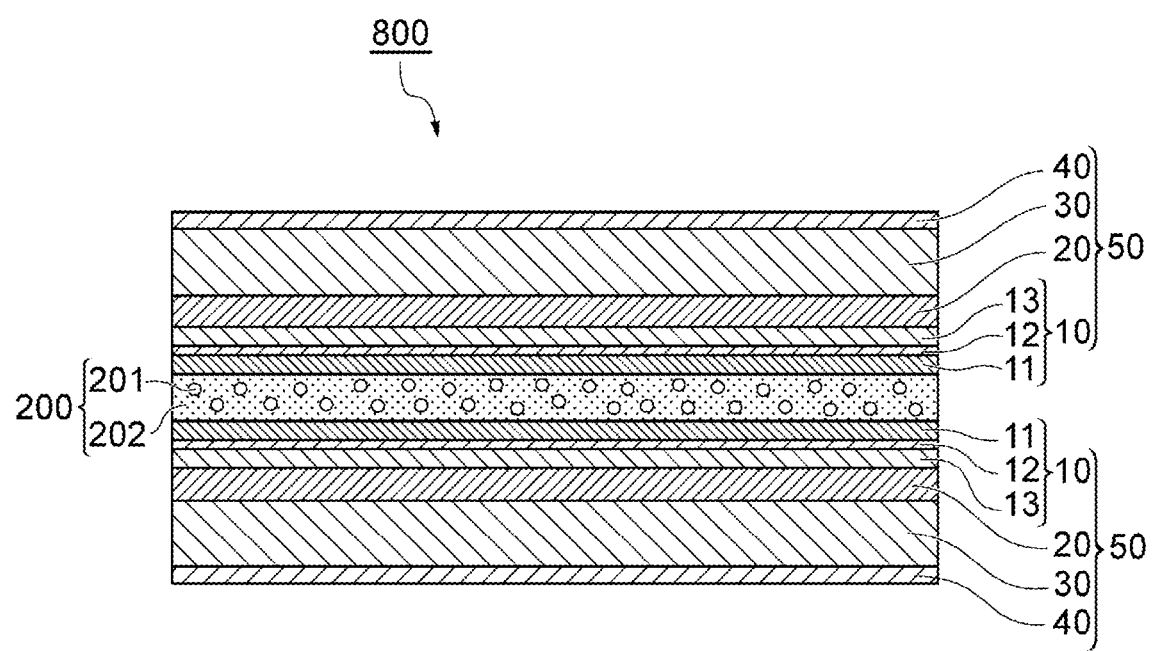
FIG. 6 is a schematic cross-sectional view showing another embodiment of a wavelength conversion sheet according to the present disclosure.
Figure 7:
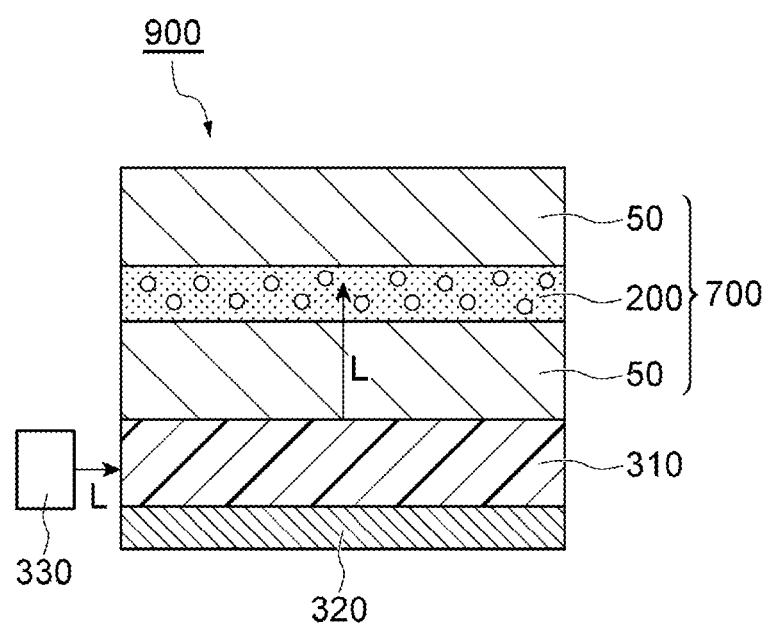
FIG. 7 is a schematic cross-sectional view showing an embodiment of a light-emitting unit according to the present disclosure.

The phosphor protective films 100, 110 and 120 can be used as a component of a wavelength conversion sheet, and a wavelength conversion sheet produced in this way can be used as a component of a light-emitting unit of a liquid crystal display such as a backlight unit and an electroluminescent light-emitting unit. FIG. 3 is a cross-sectional view schematically showing a wavelength conversion sheet 500 with a release film using the phosphor protective film 100, and FIG. 5 is cross-sectional view schematically showing a wavelength conversion sheet 700 obtained by releasing the release film 70 and the pressure-sensitive adhesive layer 60 from the wavelength conversion sheet 500 with a release film. FIG. 4 is a cross-sectional view schematically showing a wavelength conversion sheet 600 with a release film using the phosphor protective film 110, and FIG. 6 is cross-sectional view schematically showing a wavelength conversion sheet 800 obtained by releasing the release film 70 and the pressure-sensitive adhesive layer 60 from the wavelength conversion sheet 600 with a release film. FIG. 7 is a cross-sectional view schematically showing a specific example of a light-emitting unit. The wavelength conversion sheet with a release film and the wavelength conversion sheet may be formed using the phosphor protective film 120.

As shown in FIG. 3, the wavelength conversion sheet 500 with a release film includes a phosphor layer 200, and phosphor protective films 100 and 100 which are provided on the respective surfaces of the phosphor layer 200. In this way, the wavelength conversion sheet 500 with a release film has a structure in which the phosphor layer 200 is enclosed (that is, sealed) between the pair of phosphor protective films 100 and 100. Further, as shown in FIG. 5, the target wavelength conversion sheet 700 can be obtained by releasing the release film 70 and the pressure-sensitive adhesive layer 60 from the wavelength conversion sheet 500 with a release film. Moreover, the wavelength conversion sheet 600 with a release film shown in FIG. 4 is obtained by changing the phosphor protective film 100 of the wavelength conversion sheet 500 with a release film shown in FIG. 3 to the phosphor protective film 110 shown in FIG. 2. Further, as shown in FIG. 6, the target wavelength conversion sheet 800 can be obtained by releasing the release film 70 and the pressure-sensitive adhesive layer 60 from the wavelength conversion sheet 600 with a release film. As described above, because the release film 70 and the pressure-sensitive adhesive layer 60 are not present in the obtained wavelength conversion sheets 700 and 800, it is possible to achieve sufficient reduction in thickness while sufficiently suppressing the formation of wrinkles.

In the wavelength conversion sheets 500 and 600 with a release film and the wavelength conversion sheets 700 and 800, a layer for improving the adhesion between the phosphor layer 200 and the multilayer film 50 (hereinafter referred to as a "primer layer") may be provided therebetween. The thickness of the primer layer may, for example, be 0.001 to 1 μm. The primer layer may be formed, for example, using a primer layer forming composition containing a silane coupling agent.

As shown in FIGS. 3 to 6, the phosphor layer 200 is a thin film having a thickness of several tens to several hundreds of μm, and containing a sealing resin 202 and phosphors 201. A mixture of one or more types of phosphors 201 is sealed inside the sealing resin 202. When laminating the phosphor layer 200 and the pair of phosphor protective films 100 and 100 or the pair of phosphor protective film 110 and 110, the sealing resin 202 serves to join the films and fill the gaps therebetween. The phosphor layer 200 may be formed of two or more phosphor layers laminated with each other, with only one type of phosphors 201 being sealed therein. For two or more types of phosphors 201 used in such one or more phosphor layers, those having the same excitation wavelength are selected. The excitation wavelength is selected based on the wavelength of light emitted from a light source. The fluorescent colors of two or more types of phosphors 201 are different from each other. When two types of phosphors 201 are used, their fluorescent colors are preferably red and green. The fluorescence wavelengths and the wavelength of light emitted from the light source are selected based on the spectral characteristics of the color filter. The fluorescence peak wavelength may, for example, be 610 nm for red, and 550 nm for green.

For example, the sealing resin 202 may be a thermoplastic resin, a thermosetting resin, an ultraviolet-curing resin, or the like. These resins may be used singly or in combination of two or more.

Examples of thermoplastic resins include cellulose derivatives, such as acetyl cellulose, nitrocellulose, acetyl butyl cellulose, ethyl cellulose, and methyl cellulose; vinyl-based resins, such as vinyl acetate and copolymers thereof, vinyl chloride and copolymers thereof, and vinylidene chloride and copolymers thereof; acetal resins, such as polyvinyl formal and polyvinyl butyral; acrylic-based resins, such as acrylic resins and copolymers thereof, and methacrylic resins and copolymers thereof; polystyrene resins; polyamide resins; linear polyester resins; fluororesins; and polycarbonate resins.

Examples of thermosetting resins include phenol resins, urea melamine resins, polyester resins, silicone resins, and the like.

Examples of ultraviolet-curing resins include photopolymerizable prepolymers, such as epoxy acrylate, urethane acrylate, and polyester acrylate. Such a photopolymerizable prepolymer can be used as a main component, and a monofunctional or multifunctional monomer can be used as a diluent.

The phosphors 201 are preferably quantum dots. Examples of quantum dots include those in which a core serving as a light-emitting part is coated with a shell serving as a protective film. For example, the cores may be made of cadmium selenate (CdSe) or the like, and the shells may be made of zinc sulfide (ZnS) or the like. The quantum efficiency may be improved due to the surface defects of the CdSe particles being covered with ZnS having a large bandgap. The phosphors 201 may have be those having their cores doubly covered with a first shell and a second shell. In this case, CdSe may be used for the cores, zinc selenide (ZnSe) may be used for the first shell, and ZnS may be used for the second shell. Furthermore, YAG:Ce or the like may be used as the phosphors 201 instead of quantum dots.

The mean particle size of the phosphors 201 is preferably 1 to 20 nm. The thickness of the phosphor layer 200 is preferably 1 to 500 μm. The content of the phosphors 201 in the phosphor layer 200 is preferably in a range of 1 to 20% by mass, and more preferably 3 to 10% by mass relative to the total mass of the phosphor layer 200.

The wavelength conversion sheet according to the present embodiment can, for example, be produced through the following method. First, a phosphor layer forming composition containing the sealing resin 202 and the phosphors 201 is applied to the surface of the first phosphor protective film 100 or 110 on a side facing away from the release film 70 (on the gas barrier covering layer 13 or on the barrier film substrate 11), followed by curing treatment such as heating or ultraviolet irradiation to form the phosphor layer 200. After application of the phosphor layer forming composition, the second phosphor protective film 100 or 110 is prepared, and the first phosphor protective film 100 or 110, the phosphor layer 200, and the second phosphor protective film 100 or 110 can be laminated without an adhesive layer by application of pressure in a state where the coating film of the phosphor layer forming composition or the surface of the phosphor layer 200 and the surface of the second phosphor protective film 100 or 110 on the side facing away from the release film 70 are in contact with each other. The curing treatment such as heating or ultraviolet irradiation may be performed before lamination of the second phosphor protective film 100 or 110, or may be performed after lamination of the second phosphor protective film 100 or 110.

Although the timing at which the release film 70 and the pressure-sensitive adhesive layer 60 are released from the wavelength conversion sheet 500 or 600 with a release film is not particularly limited, they may, for example, be released at the stage of incorporation into the light-emitting unit described below after being cut according to the display panel size. By arranging the release film 70 at the outermost surface during the production process of the wavelength conversion sheet and during cutting of the wavelength conversion sheet 500 or 600 with a release film, it is possible to prevent damage to the wavelength conversion sheet during the production process.

As mentioned above, the wavelength conversion sheets 700 and 800 can be used as a component of a light-emitting unit 900.

As shown in FIG. 7, the light-emitting unit 900 includes a light source 330, a light guide plate 310, and a wavelength conversion sheet 700. Specifically, in the light-emitting unit 900, the light guide plate 310 and a reflective plate 320 are disposed in this order on the surface of one of the multilayer films 50, and the light source 330 is arranged on a lateral side of the light guide plate 310. The thickness of the light guide plate 310 may, for example, be 100 to 1,000 μm.

The light guide plate 310 and the reflective plate 320 efficiently reflect the light emitted from the light source 330, and guide the light to the phosphor layer 200. Examples of the material of the light guide plate 310 include acrylic films, polycarbonate films, and cycloolefin films. The light source 330 may include, for example, a plurality of blue light emitting diode elements. The light-emitting diode elements may be purple light-emitting diodes or light-emitting diodes having an even shorter wavelength. The light emitted from the light source 330 is incident on the light guide plate 310 and then enters the phosphor layer 200 as a result of reflection, diffraction, and the like.

The light that has passed through the phosphor layer 200 becomes white light due to the yellow light generated in the phosphor layer 200 mixing with light which has not passed through the phosphor layer 200. Because the performance of the phosphor layer 200 may decrease due to contact with oxygen, water vapor or the like over a long period of time, it is protected by a pair of multilayer films 50 and 50 as shown in FIG. 7. Furthermore, in FIG. 7, the wavelength conversion sheet 700 may be replaced with the wavelength conversion sheet 800, and may be replaced with a wavelength conversion sheet formed using the phosphor protective film 120.

EXAMPLES

The present disclosure will be more specifically described below based on Examples and Comparative Examples; however, the present disclosure is not limited to the following Examples. Furthermore, the peel strength between the release films with a pressure-sensitive adhesive layer prepared in the Examples and a mat layer was measured using the following method.

<Measurement of Peel Strength (Adhesive Strength) Between Release Film with Pressure-Sensitive Adhesive Layer and Mat Layer>

A release film with a pressure-sensitive adhesive layer and a multilayer film having a laminated mat layer were overlaid so that the mat layer and pressure-sensitive adhesive layer faced each other, and these were pressed using a heat laminator (lamination temperature 40° C., transfer speed 1 m/min, and lamination pressure 0.5 MPa). The adhesive strength required to release the two pressed test samples was measured using an Autograph AG-X (manufactured by Shimadzu Corp.). The measurement conditions were as follows: T-type release, tensile speed 300 mm/min, 25° C., and 40% RH atmosphere.

Example 1

A barrier film was produced in the following manner. First, silicon oxide was provided as an inorganic thin film layer by vacuum vapor deposition on one surface of a PET film serving as a barrier film substrate, and a gas barrier covering layer was formed on the inorganic thin film layer. The gas barrier covering layer was formed using a wet coating method by applying a coating liquid obtained by mixing tetraethoxysilane and polyvinyl alcohol at a mass ratio of 1:1, followed by heating and drying at 180° C. for 1 minute. As a result, a barrier film provided with the inorganic thin film layer and the gas barrier covering layer on one surface of the substrate was obtained. The barrier film had a thickness of 12.5 μm, the barrier film substrate had a thickness of 12 μm, the inorganic thin film layer had a thickness of 30 nm, and the gas barrier covering layer had a thickness of 0.5 μm.

Next, a mat layer forming composition composed of 100 parts by mass of an acrylic polyol resin (manufactured by DIC Corp., trade name: OPM adjusting varnish), 8.5 parts by mass of an isocyanate-based curing agent (manufactured by DIC Corp., trade name: OPM curing agent), 10 parts by mass of microparticles (polyurethane, mean particle size 2 μm), and 70 parts by mass of a solvent (ethyl acetate) was applied to the barrier film substrate of the barrier film described above, and then cured by heating and drying for 1 minute at 80° C. to form a mat layer having a thickness of 3 μm. As a result, a multilayer film was obtained in which the barrier film and the mat layer were laminated.

A pressure-sensitive adhesive layer forming composition composed of 100 parts by mass of an acrylic-based pressure-sensitive adhesive (manufactured by Saiden Chemical Industry Co., Ltd., trade name: Saivinol MS-3999), 5 parts by mass of an isocyanate-based curing agent (manufactured by Saiden Chemical Industry Co., Ltd., trade name: Saivinol K-315), 2 parts by mass of a stabilizer (acetylacetone), and 221 parts by mass of a solvent (ethyl acetate) was applied to one surface of a PET film having a thickness of 50 μm serving as a release film, and then heated and dried for 1 minute at 80° ° C. to form a pressure-sensitive adhesive layer having a thickness of 3.5 μm. As a result, a release film with a pressure-sensitive adhesive layer was obtained (peel strength with respect to mat layer: 0.50 N/25 mm).

The multilayer film and the release film with a pressure-sensitive adhesive layer were overlaid so that the mat layer and the pressure-sensitive adhesive layer were in contact with each other, and these were pressed together using a heat laminator (lamination temperature 40° C., transfer speed 1 m/min, and lamination pressure 0.5 MPa) to obtain a phosphor protective film. The obtained phosphor protective film did not have a support film between the barrier film and the release film, and the thickness of the release film was 72% of the total thickness of the phosphor protective film.

Examples 2 to 6

The phosphor protective films of Examples 2 to 6 were obtained in the same manner as in Example 1, except for changing the thickness of the barrier film and the thickness of the release film to the thicknesses shown in Table 1. Here, when the thickness of the barrier film was 23.5 μm, the thicknesses of the inorganic thin film layer and gas barrier covering layer were not changed, and the thickness of the barrier film substrate was 23 μm.

Example 7

A barrier film was produced in the following manner. First, silicon oxide was provided as an inorganic thin film layer by vacuum vapor deposition on one surface of a PET film serving as a barrier film substrate, and a gas barrier covering layer was formed on the inorganic thin film layer. The gas barrier covering layer was formed using a wet coating method by applying a coating liquid obtained by mixing tetraethoxysilane and polyvinyl alcohol at a mass ratio of 1:1, followed by heating and drying at 180° C. for 1 minute. As a result, a barrier film provided with the inorganic thin film layer and the gas barrier covering layer on one surface of the substrate was obtained. The thickness of the barrier film was 12.5 μm.

Then, an adhesive layer forming composition composed of 100 parts by mass of an acrylic-based pressure-sensitive adhesive (manufactured by Saiden Chemical Industry Co., Ltd., trade name: Saivinol OC-3405), 1 part by mass of an isocyanate-based curing agent (manufactured by Saiden Chemical Industry Co., Ltd., trade name: Saivinol K-341), and 219 parts by mass of a solvent (toluene) was applied to the gas barrier covering layer of the barrier film described above, and then heated and dried for 1 minute at 80° ° C. to form an adhesive layer. A PET film having a thickness of 25 μm was overlaid as a support film on the adhesive layer, and these were pressed using a heat laminator (lamination temperature 40° C., transfer speed 1 m/min, and lamination pressure 0.5 MPa). The pressing was performed in a state where the wrinkles of the barrier film were smoothed by nipping. Then, a mat layer forming composition composed of 100 parts by mass of an acrylic polyol resin (manufactured by DIC Corp., trade name: OPM adjusting varnish), 8.5 parts by mass of an isocyanate-based curing agent (manufactured by DIC Corp., trade name: OPM curing agent), 10 parts by mass of microparticles (polyurethane, mean particle size 2 μm), and 70 parts by mass of a solvent (ethyl acetate) was applied to the support film described above, and cured by heating and drying to form a mat layer having a thickness of 3 μm. As a result, a multilayer film was obtained in which a barrier film, an adhesive layer, a support film, and a mat layer were laminated in this order. In the obtained multilayer film, the adhesive layer had a thickness of 5 μm.

A pressure-sensitive adhesive layer forming composition composed of 100 parts by mass of an acrylic-based pressure-sensitive adhesive (manufactured by Saiden Chemical Industry Co., Ltd., trade name: Saivinol MS-3999), 5 parts by mass of an isocyanate-based curing agent (manufactured by Saiden Chemical Industry Co., Ltd., trade name: Saivinol K-315), 2 parts by mass of a stabilizer (acetylacetone), and 221 parts by mass of a solvent (ethyl acetate) was applied to one surface of a PET film having a thickness of 25 μm serving as a release film, and then heated and dried for 1 minute at 80° ° C. to form a pressure-sensitive adhesive layer having a thickness of 3.5 μm. As a result, a release film with a pressure-sensitive adhesive layer was obtained (peel strength with respect to mat layer: 0.50 N/25 mm).

The multilayer film and the release film with a pressure-sensitive adhesive layer were overlaid so that the mat layer and the pressure-sensitive adhesive layer were in contact with each other, and these were pressed together using a heat laminator (lamination temperature 40° ° C., transfer speed 1 m/min, and lamination pressure 0.5 MPa) to obtain a phosphor protective film. The obtained phosphor protective film had the support film between the barrier film and the release film, and the total thickness of the support film and the release film was 68% of the total thickness of the phosphor protective film.

Examples 8 to 13

The phosphor protective films of Examples 8 to 13 were obtained in the same manner as in Example 7, except for changing the thickness of the barrier film and the thickness of the release film to the thicknesses shown in Table 1. Here, when the thickness of the barrier film was 23.5 μm, the thicknesses of the inorganic thin film layer and gas barrier covering layer were not changed, and the thickness of the barrier film substrate was 23 μm.

Example 14

The phosphor protective film was obtained in the same manner as in Example 9, except for using a PEN film having a thickness of 75 μm as the release film. The peel strength between the release film with a pressure-sensitive adhesive layer and the mat layer was 0.16 N/25 mm.

Example 15

The phosphor protective film was obtained in the same manner as in Example 10, except for using a PEN film having a thickness of 100 μm as the release film.

Comparative Example 1

The phosphor protective film of Comparative Example 1 was obtained in the same manner as in Example 1 except that the release film with a pressure-sensitive adhesive layer was not laminated.

Comparative Example 2

The phosphor protective film of Comparative Example 1 was obtained in the same manner as in Example 4 except that the release film with a pressure-sensitive adhesive layer was not laminated.

Comparative Example 3

The phosphor protective film of Comparative Example 1 was obtained in the same manner as in Example 7 except that the release film with a pressure-sensitive adhesive layer was not laminated.

Comparative Example 4

The phosphor protective film of Comparative Example 1 was obtained in the same manner as in Example 11 except that the release film with a pressure-sensitive adhesive layer was not laminated.

<Evaluation of Degree of Wrinkling>

The phosphor protective films obtained in the Examples and Comparative Examples were visually observed in terms of the presence/absence of wrinkles and the degree of wrinkling, and the degree of wrinkling was evaluated based on the following evaluation criteria. A "D" evaluation is a failure result. The results are shown in Table 1.
A: No wrinkles were observed.
B: A few shallow and small wrinkles were observed.
C: Moderate wrinkles were observed.
D: Deep and large wrinkles were observed.

TABLE 1

|  | Thickness of barrier film (μm) | Thickness of support film (μm) | Thickness of release film (μm) | Material of release film | Release film thickness + support film thickness/total thickness (%) | Wrinkle evaluation |
|---|---|---|---|---|---|---|
| Example 1 | 12.5 | — | 50 | PET | 72 | B |
| Example 2 | 12.5 | — | 75 | PET | 80 | A |
| Example 3 | 12.5 | — | 100 | PET | 84 | A |
| Example 4 | 23.5 | — | 50 | PET | 63 | C |
| Example 5 | 23.5 | — | 75 | PET | 71 | B |
| Example 6 | 23.5 | — | 100 | PET | 77 | A |
| Example 7 | 12.5 | 25 | 25 | PET | 68 | C |
| Example 8 | 12.5 | 25 | 50 | PET | 76 | A |
| Example 9 | 12.5 | 25 | 75 | PET | 81 | A |
| Example 10 | 12.5 | 25 | 100 | PET | 84 | A |
| Example 11 | 23.5 | 25 | 50 | PET | 68 | C |
| Example 12 | 23.5 | 25 | 75 | PET | 74 | B |
| Example 13 | 23.5 | 25 | 100 | PET | 78 | A |
| Example 14 | 12.5 | 25 | 75 | PEN | 81 | B |
| Example 15 | 12.5 | 25 | 100 | PEN | 84 | B |
| Comparative Example 1 | 12.5 | — | — | — | — | D |
| Comparative Example 2 | 23.5 | — | — | — | — | D |
| Comparative Example 3 | 12.5 | 25 | — | — | — | D |
| Comparative Example 4 | 23.5 | 25 | — | — | — | D |

Example 16

A mat layer forming composition composed of 100 parts by mass of an acrylic polyol resin (manufactured by DIC Corp., trade name: OPM adjusting varnish), 8.5 parts by mass of an isocyanate-based curing agent (manufactured by DIC Corp., trade name: OPM curing agent), 10 parts by mass of microparticles (polyurethane, mean particle size 2 μm), and 70 parts by mass of a solvent (ethyl acetate) was applied to a PET film having a thickness of 12.5 μm serving as a support film, and then heated and dried for 1 minute at 80° C. to form a mat layer having a thickness of 3 μm. Further, a primer layer forming composition obtained by diluting 3-aminopropyltriethoxysilane (amine-based silane coupling agent, manufactured by Shin-Etsu Chemical Co., Ltd., trade name: KBE-903) to a solid content of 1.5% by mass using ethyl acetate was applied to the opposite side of the support film to that facing the mat layer using a wire bar #3, and then dried for 1 minute at 120° C. to form a primer layer having a thickness of 30 μm. The support film, the mat layer, and the primer layer were used as the main body. A pressure-sensitive adhesive layer forming composition composed of 100 parts by mass of an acrylic-based pressure-sensitive adhesive (manufactured by Saiden Chemical Industry Co., Ltd., trade name: Saivinol MS-3999), 5 parts by mass of an isocyanate-based curing agent (manufactured by Saiden Chemical Industry Co., Ltd., trade name: Saivinol K-315), 2 parts by mass of a stabilizer (acetylacetone), and 221 parts by mass of a solvent (ethyl acetate) was applied to one surface of a PET film having a thickness of 25 μm serving as a release film, and then heated and dried for 1 minute at 80° C. to form a pressure-sensitive adhesive layer having a thickness of 5 μm. As a result, a release film with a pressure-sensitive adhesive layer was obtained (peel strength with respect to support film: 0.08 N/25 mm).

The main body and the release film with a pressure-sensitive adhesive layer were overlaid so that the support film and the pressure-sensitive adhesive layer were in contact with each other, and these were pressed together using a heat laminator (lamination temperature 40° C., transfer speed 1 m/min, and lamination pressure 0.5 MPa) to form a phosphor protective film. In the obtained phosphor protective film, the thickness of the release film was 55% of the total thickness of the phosphor protective film (the total thickness of the support film, the mat layer, the primer layer, the pressure-sensitive adhesive layer, and the release film).

Examples 17 to 29 and Comparative Examples 5 to 8

The phosphor protective films of Examples 17 to 29 and Comparative Examples 5 to 8 were obtained in the same manner as in Example 16, except for changing the thicknesses of the support film and/or release film to the thicknesses shown in Table 2.

<Evaluation of Degree of Wrinkling>

The phosphor protective films obtained in the Examples and Comparative Examples were visually observed in terms of the presence/absence of wrinkles and the degree of wrinkling, and the degree of wrinkling was evaluated based on the following evaluation criteria. The results are shown in Table 2.

A: No wrinkles were observed.
B: A few shallow and small wrinkles were observed.
C: Moderate wrinkles were observed.
D: Deep and large wrinkles were observed.

TABLE 2

|  | Thickness of support film (μm) | Thickness of release film (μm) | Release film thickness/total thickness (%) | Wrinkle evaluation |
|---|---|---|---|---|
| Example 16 | 12.5 | 25 | 55 | A |
| Example 17 | 12.5 | 50 | 71 | A |
| Example 18 | 12.5 | 75 | 79 | A |
| Example 19 | 12.5 | 100 | 83 | A |
| Comparative Example 5 | 23.5 | 25 | 44 | C |
| Example 20 | 23.5 | 50 | 61 | A |
| Example 21 | 23.5 | 75 | 70 | A |
| Example 22 | 23.5 | 100 | 76 | A |
| Comparative Example 6 | 38.5 | 25 | 35 | C |
| Example 23 | 38.5 | 50 | 52 | A |
| Example 24 | 38.5 | 75 | 62 | A |
| Example 25 | 38.5 | 100 | 68 | A |
| Example 26 | 38.5 | 125 | 73 | A |
| Comparative Example 7 | 50.5 | 25 | 30 | B |
| Comparative Example 8 | 50.5 | 50 | 46 | B |
| Example 27 | 50.5 | 75 | 56 | A |
| Example 28 | 50.5 | 100 | 63 | A |
| Example 29 | 50.5 | 150 | 72 | A |

Example 30

A barrier film was produced in the following manner. First, silicon oxide was provided as an inorganic thin film layer by vacuum vapor deposition on one surface of a PET film serving as a barrier film substrate, and a gas barrier covering layer was formed on the inorganic thin film layer. The gas barrier covering layer was formed using a wet coating method by applying a coating liquid obtained by mixing tetraethoxysilane and polyvinyl alcohol at a mass ratio of 1:1, followed by heating and drying at 180° C. for 1 minute. As a result, a barrier film provided with the inorganic thin film layer and the gas barrier covering layer on one surface of the substrate was obtained. The barrier film had a thickness of 23.5 μm, the barrier film substrate had a thickness of 23 μm, the inorganic thin film layer had a thickness of 30 nm, and the gas barrier covering layer had a thickness of 0.5 μm.

Next, a mat layer forming composition composed of 100 parts by mass of an acrylic polyol resin (manufactured by DIC Corp., trade name: OPM adjusting varnish), 8.5 parts by mass of an isocyanate-based curing agent (manufactured by DIC Corp., trade name: OPM curing agent), 10 parts by mass of microparticles (polyurethane, mean particle size 2 μm), and 70 parts by mass of a solvent (ethyl acetate) was applied to the barrier film substrate of the barrier film described above, and then cured by heating and drying for 1 minute at 80° C. to form a mat layer having a thickness of 3 μm. As a result, a multilayer film was obtained in which the barrier film and the mat layer were laminated.

A pressure-sensitive adhesive layer forming composition composed of 100 parts by mass of an acrylic-based pressure-sensitive adhesive (manufactured by Saiden Chemical Industry Co., Ltd., trade name: Saivinol MS-3999), 5 parts by mass of an isocyanate-based curing agent (manufactured by Saiden Chemical Industry Co., Ltd., trade name: Saivinol K-315), 2 parts by mass of a stabilizer (acetylacetone), and 221 parts by mass of a solvent (ethyl acetate) was applied to one surface of a PET film having a thickness of 75 μm serving as a release film, and then heated and dried for 1 minute at 80° ° C. to form a pressure-sensitive adhesive layer having a thickness of 3.5 μm. As a result, a release film with a pressure-sensitive adhesive layer was obtained (peel strength with respect to mat layer: 0.50 N/25 mm).

The multilayer film and the release film with a pressure-sensitive adhesive layer were overlaid so that the mat layer and the pressure-sensitive adhesive layer were in contact with each other, and these were pressed together using a heat laminator (lamination temperature 40° C., transfer speed 1 m/min, and lamination pressure 0.5 MPa) to obtain a phosphor protective film. The obtained phosphor protective film did not have a support film between the barrier film and the release film, and the thickness of the release film was 71% of the total thickness of the phosphor protective film.

Comparative Example 9

A multilayer film was prepared through the same method as Example 30, and this was used as the phosphor protective film. This phosphor protective film was not provided with a release film.

<Measurement of Variation (3σ) in Total Thickness of Multilayer Film and Phosphor Protective Film>

The film thickness (total thickness) of the multilayer film and the phosphor protective film obtained in Example 30 and Comparative Example 9 was measured at 50 random points, and the average value, the maximum value, the minimum value, and the variation (3σ) were calculated. The film thickness was measured using a contact-type film thickness meter (model number: LGF-0110L-B, manufactured by Mitutoyo Corp.). The results are shown in Table 3.

<Measurement of Kinetic Friction Coefficient of Mat Layer Surface>

The kinetic friction coefficient of the mat layer surface of the multilayer films obtained in Example 30 and Comparative Example 9 was measured using the following method. The measurement was performed according to JIS K7125 using an Autograph AG-X (manufactured by Shimadzu Corp.). The results are shown in Table 3.

<Evaluation of Unevenness in Light Emission from Phosphor Layer>

(Production of Wavelength Conversion Sheet)

Two sheets of each of the phosphor protective films obtained in Example 30 and Comparative Example 9 were prepared, and wavelength conversion sheets were prepared according to the following procedure. First, a coating film was formed on the gas barrier covering layer of one of the phosphor protective films by application of a phosphor layer forming composition containing quantum dot emitters having a cadmium selenide (CdSe) core, a zinc sulfide (ZnS) shell, and a mean particle size of 6 nm; an acrylic photocurable resin having an acryloyl group at the end of the main chain or side chain (manufactured by Arakawa Chemical Industries, Ltd., trade name: AP6501); and a photopolymerization initiator (manufactured by BASF, trade name: Lucirin TPO). The other phosphor protective film was bonded thereto with the gas barrier covering layer facing the coating film, and then the films were pressed together by nipping them between two rolls. The coating film was cured by exposure to an exposure amount of 300 mJ/cm$^2$ using an ultraviolet irradiation apparatus, thereby forming a phosphor layer (thickness 100 μm) having a wavelength conversion function. Then, in Example 30, the release film was released from the mat layer. As a result, the wavelength conversion sheet was obtained.

(Evaluation of Light Emission Unevenness)

The presence/absence of unevenness in light emission from the phosphor layer of the obtained wavelength conversion sheets was visually observed and evaluated. The results are shown in Table 3.

TABLE 3

| | | Example 30 | Comparative Example 9 |
|---|---|---|---|
| Total thickness of phosphor protective film (μm) | Average | 104.79 | 26.52 |
| | Maximum | 105.3 | 28.1 |
| | Minimum | 104.1 | 25.2 |
| | n | 50 | 50 |
| | 3σ (variation) | 0.89 | 2.04 |
| Total thickness of multilayer film (μm) | Average | 26.48 | 26.52 |
| | Maximum | 28.3 | 28.1 |
| | Minimum | 25.1 | 25.2 |
| | n | 50 | 50 |
| | 3σ (variation) | 2.09 | 2.04 |
| Kinetic friction coefficient of mat layer surface | | 0.3 | 0.5 |
| Unevenness in light emission from phosphor layer | | No | Yes |

REFERENCE SIGNS LIST

10 . . . Barrier film; 11 . . . Barrier film substrate; 12 . . . Inorganic thin film layer; 13 . . . Gas barrier covering layer; 20 . . . Adhesive layer; 30 . . . Support film; 40 . . . Functional layer; 50 . . . Multilayer film; 55 . . . Main body; 60 . . . Pressure-sensitive adhesive layer; 70 . . . Release film; 80 . . . Primer layer; 100, 110, 120 . . . Phosphor protective film; 200 . . . Phosphor Layer; 201 . . . Phosphor; 202 . . . Sealing resin; 310 . . . Light guide plate; 320 . . . Reflective plate; 330 . . . Light source; 500, 600 . . . Wavelength conversion sheet with release film; 700, 800 . . . Wavelength conversion sheet; 900 . . . Light-emitting unit.

What is claimed is:

1. A production method for a wavelength conversion sheet, comprising the steps of:
    a bonding step of bonding a multilayer film and a release film together to obtain a phosphor protective film, the multilayer film including a barrier film, the release film being releasable from the multilayer film;
    a phosphor layer formation step of forming a phosphor layer containing phosphors on a surface of the multilayer film of the phosphor protective film to obtain a wavelength conversion sheet with the release film; and
    a release step of releasing the release film from the wavelength conversion sheet with the release film.

2. The production method of claim 1, wherein in the bonding step, the multilayer film and the release film are bonded to each other in a state where wrinkles in the multilayer film have been smoothed out.

3. The production method of claim 1, wherein, in the phosphor layer formation step, the phosphor layer is formed between two sheets of the phosphor protective film.

4. The production method of claim 1, wherein
    the multilayer film includes a support film between the barrier film and the release film, and
    a total thickness of the support film and the release film represents 60% or more of a total thickness of the phosphor protective film.

5. The production method of claim 1, wherein
    the multilayer film does not include a support film between the barrier film and the release film, and
    a thickness of the release film represents 50% or more of a total thickness of the phosphor protective film.

6. The production method of claim 1, wherein the barrier film includes a barrier film substrate having a thickness of 9 to 25 μm.

7. The production method of claim 1, wherein the barrier film includes a barrier film substrate and an inorganic thin film layer provided on the barrier film substrate.

8. The production method of claim 1, wherein
the multilayer film is provided with a functional layer on a side facing the release film, and
the functional layer is a layer that exhibits at least one type of function selected from the group consisting of an interference fringe prevention function, an antireflection function, a light diffusion function, an antistatic function, and a scratch prevention function.

9. The production method of claim 1, wherein a variation (3σ) in a total thickness of the multilayer film is 1.5 μm or more, and a kinetic friction coefficient of a surface of the functional layer is 0.4 or less.

10. The production method of claim 1, wherein a variation (3σ) in a total thickness of the phosphor protective film is 1.0 μm or less.

11. The production method of claim 1, wherein a peel strength according to JIS K6854-3 between the multilayer film and the release film is 0.05 to 1.0 N/25 mm.

12. A production method for a wavelength conversion sheet, comprising the steps of:
a bonding step of bonding a main body and a release film together to obtain a phosphor protective film, the main body including a support film, the release film being releasable from the main body;
a phosphor layer formation step of forming a phosphor layer containing phosphors on a surface of the main body of the phosphor protective film to obtain a wavelength conversion sheet with the release film; and
a release step of releasing the release film from the wavelength conversion sheet with the release film, wherein
a thickness of the release film represents 50% or more of a total thickness of the phosphor protective film.

13. The production method of claim 12, wherein in the bonding step, the main body and the release film are bonded to each other in a state where wrinkles in the main body have been smoothed out.

14. The production method of claim 12, wherein in the phosphor layer formation step, the phosphor layer is formed between two sheets of the phosphor protective film.

15. The production method of claim 12, wherein the support film has a thickness of 12 to 50 μm.

16. The production method of claim 12, wherein the release film has a thickness of 25 to 150 μm.

17. The production method of claim 12, wherein
the main body is provided with a functional layer on a side facing the release film, and
the functional layer is a layer that exhibits at least one type of function selected from the group consisting of an interference fringe prevention function, an antireflection function, a light diffusion function, an antistatic function, and a scratch prevention function.

* * * * *